United States Patent
Ye et al.

(10) Patent No.: US 11,898,267 B2
(45) Date of Patent: Feb. 13, 2024

(54) NONLINEAR OPTICAL CRYSTAL FLUORINE BORON BERYLLIUM SALT AND ITS PREPARATION PROCESS AND USE

(71) Applicant: FUJIAN INSTITUTE OF RESEARCH ON THE STRUCTURE OF MATTER, CHINESE ACADEMY OF SCIENCES, Fujian (CN)

(72) Inventors: Ning Ye, Fujian (CN); Guang Peng, Fujian (CN); Min Luo, Fujian (CN); Ge Zhang, Fujian (CN); Yu Chen, Fujian (CN)

(73) Assignee: FUJIAN INSTITUTE OF RESEARCH ON THE STRUCTURE OF MATTER, CHINESE ACADEMY OF SCIENCES, Fujian (CN)

(*) Notice: Subject to any disclaimer, the term of this patent is extended or adjusted under 35 U.S.C. 154(b) by 690 days.

(21) Appl. No.: 17/095,492

(22) Filed: Nov. 11, 2020

(65) Prior Publication Data

US 2021/0062363 A1     Mar. 4, 2021

Related U.S. Application Data

(63) Continuation-in-part of application No. 15/763,734, filed as application No. PCT/CN2015/099397 on Dec. 29, 2015, now Pat. No. 10,858,756.

(30) Foreign Application Priority Data

Sep. 29, 2015  (CN) .......................... 201510629534.5
Sep. 29, 2015  (CN) .......................... 201510629660.0

(51) Int. Cl.
*C30B 29/12*   (2006.01)
*C30B 29/66*   (2006.01)
(Continued)

(52) U.S. Cl.
CPC ................ *C30B 29/12* (2013.01); *C30B 7/10* (2013.01); *C30B 9/12* (2013.01); *C30B 29/66* (2013.01);
(Continued)

(58) Field of Classification Search
CPC ........... C30B 29/12; C30B 29/66; C30B 7/10; C30B 35/002; C30B 9/12; C30B 29/10;
(Continued)

(56) References Cited

U.S. PATENT DOCUMENTS 10,858,756 B2 * 12/2020 Ye .......................... G02F 1/3551

FOREIGN PATENT DOCUMENTS

CN     101050543 A     10/2007
CN     101200809 A     6/2008
(Continued)

OTHER PUBLICATIONS

Xia, Wenbing, et al., "A New Type of Potential Nonlinear Optical Material—Beryllium Fluoride Borate", Journal of Synthetic Crystals, vol. 34, No. 4, Aug. 30, 2005 (Aug. 30, 2005), ISSN: 1000-985X, p. 598.

(Continued)

*Primary Examiner* — Timothy C Vanoy
(74) *Attorney, Agent, or Firm* — NKL Law; Allen Xue

(57) ABSTRACT

Crystalline $NH_4Be_2BO_3F_2$ or $Be_2BO_3F$ (abbreviated as BBF) has nonlinear optical effect, is not deliquescent in the air, is chemically stable. They can be used in a variety of nonlinear optical fields and will pioneer the nonlinear optical applications in the deep UV band.

13 Claims, 8 Drawing Sheets

(51) Int. Cl.
  *C30B 7/10* (2006.01)
  *C30B 35/00* (2006.01)
  *C30B 9/12* (2006.01)
  *G02F 1/39* (2006.01)
  *G02F 1/355* (2006.01)
  *G02F 1/35* (2006.01)
  *C01B 35/12* (2006.01)

(52) U.S. Cl.
  CPC ............ *C30B 35/002* (2013.01); *G02F 1/353* (2013.01); *G02F 1/3551* (2013.01); *G02F 1/39* (2013.01); *C01B 35/128* (2013.01)

(58) Field of Classification Search
  CPC .......... G02F 1/3551; G02F 1/353; G02F 1/39; G02F 1/37; G02F 2001/354; G02F 2001/392; C01B 35/128; C01B 3/126
  See application file for complete search history.

(56) References Cited

FOREIGN PATENT DOCUMENTS

| | | |
|---|---|---|
| CN | 102828245 A | 12/2012 |
| CN | 102828246 A | 12/2012 |
| CN | 1928167 A | 3/2014 |
| CN | 104092092 A | 10/2014 |

OTHER PUBLICATIONS

Kang et al., "First-Principles Design of a Deep-Ultraviolet Nonlinear-Optical Crystal from KBe2BO3F2 to NH4Be2BO3F2", Inorganic Chemistry, 2015, 54, 00. 10533-10535 (Year: 2015).

McMillen et al, "Hydrothermal crystal growth of ABe2BO3F2 (A—K, Rb, Cs, Tl) NLO crystals", Journal of Crystal Growth, 310, 2008, pp. 2033-2038. (Year: 2008).

* cited by examiner

NONLINEAR OPTICAL CRYSTAL FLUORINE BORON BERYLLIUM SALT AND ITS PREPARATION PROCESS AND USE

CROSS-REFERENCE TO RELATED APPLICATIONS

The application is a continuation in part of U.S. application Ser. No. 15/763,734, filed Mar. 27, 2018, which is a U.S. national phase application of PCT International Application No. PCT/CN2015/099397, filed Dec. 29, 2015, which claims the priority to Chinese Application Nos. 201510629534.5 and 201510629660.0, both filed on Sep. 29, 2015, the contents of which are incorporated herein by reference in their entirety.

TECHNICAL FIELD

The present invention relates to a novel optoelectronic functional material, and its growth method and use, particularly to a nonlinear optical crystalline material and its preparation process and use, namely, fluorine boron beryllium salt, specifically, ammonium beryllium borate fluoride, whose chemical formula is $NH_4Be_2BO_3F_2$ (abbreviated as ABBF) and beryllium borate fluoride, whose chemical formula is $Be_2BO_3F$ (abbreviated as BBF).

BACKGROUND TECHNOLOGY

The nonlinear optical effect of a crystal refers to the effect that: when a laser beam having a specific polarization direction passes through a piece of nonlinear optical crystal (such as a borate nonlinear optical crystal) in a specific incident direction, the beam will have its frequency changed.

Crystal with nonlinear optical effect is named as nonlinear optical crystal. The use of nonlinear optical crystal for laser frequency conversion, broadening the range of the laser wavelength, thus laser is more widely used. In particular, borate nonlinear optical crystals such as $BaB_2O_4$ (BBO), $LiB_3O_5$ (LBO), $KBe_2BO_3F_2$ (KBBF), $Sr_2Be_2B_2O_7$ (SBBO), $Ba_2Be_2B_2O_7$ (TBO), $K_2Al_2B_2O_7$ (KABO), $BaAl_2B_2O_7$ (BABO) have drawn much attention for their excellent optical properties. In fields such as optical photography, photolithography and precision instrument processing, there is an increasing need for UV and deep UV laser coherent light sources, that is, there is need for UV and deep UV nonlinear optical crystals with excellent properties.

The basic structural motif of BBO crystal is $(B_3O_6)^{3-}$ planar group, which has a large conjugated π bond, so that BBO has the UV absorption edge of about 189 nm, thus the crystal's application in the UV region is limited. Further, the large conjugated π bond will also result in a relatively large birefringence (Δn=0.12), thereby limiting its harmonic conversion efficiency and the quality of harmonic light.

The basic structural motif of KBBF is the $(BO_3)^{3-}$ planar group. This crystal has a UV absorption edge of about 155 nm and a moderate birefringence (Δn=0.07), and can achieve a wide range of phase matching. So far, it is the best deep UV nonlinear optical crystal. However, since KBBF is a crystal of layered structure and the layers are linked with each other by electrostatic attraction but not by valence bonds, the crystal has serious layered habit and very slow growth in the z direction, the grown single crystals are obviously layered, and the crystals are not easy to grow.

SBBO also has $(BO_3)^{3-}$ planar group as the basic structural motif, but it replaces fluorine ion with oxygen, so that the layers are linked with each other by oxygen bridges, thereby improving the layered habit of KBBF, while the structure of each layer remains basically unchanged. SBBO not only has a relatively large macroscopic frequency doubling coefficient, a low UV absorption edge (165 nm), and a moderate birefringence (Δn=0.06), but also completely overcomes the layered habit of crystal and solves the problem of crystal growth. Based on this, a series of nonlinear optical crystals such as TBO, KABO and BABO have been successively prepared by replacing the cation $Sr^{2+}$ and Be atom while maintaining the structural condition of the $(BO_3)^{3-}$ group substantially unchanged. They are collectively referred to as SBBO family crystals. They have overcome the layered habit of KBBF single crystals in growing, but these crystals have so far not been able to replace KBBF single crystals. That is because the SBBO and TBO crystals have poor structural integrity, their macroscopic properties reveal very poor optical uniformity, and so far they have not been able to be applied in practical devices; the KABO and BABO crystals have very good structural integrity and good optical uniformity, but since Al replaces Be, their absorption edge is red shifted to about 180 nm and are hard to be used in deep UV harmonic output.

The basic structural motif of LBO is $(B_3O_7)^{5-}$ group formed by conversion of one B atom in the $(B_3O_6)^{3-}$ group from the tri-coordination to the tetra-coordination. It has a relatively large frequency doubling coefficient and a UV absorption edge of about 160 nm. However, the $(B_3O_7)^{5-}$ groups in the actual crystals are linked to each other, a helical chain of 45° to the z axis is formed in the space, so that parallel arrangement in lattice cannot be achieved, thus the crystal has the birefringence decreased to an overly low point (Δn=0.04-0.05), thereby severely limiting its phase matching range in the UV region and not giving full play to the advantage of wide bandgap.

Thus, novel UV and deep UV nonlinear optical crystals with excellent performance in all aspects are yet to be developed.

Contents of Invention (I) Fluorine Boron Beryllium Salt Nonlinear Optical Crystalline Material The object of the present invention is to overcome the deficiencies of the prior art and to provide a novel type of fluorine boron beryllium salt.

To achieve the object of the present invention, the present invention provides the following technical solution:

a fluorine boron beryllium salt, which is ammonium beryllium borate fluoride (chemical formula I) compound, or beryllium borate fluoride (chemical formula II) compound:

$NH_4Be_2BO_3F_2(Be_2BO_3F \cdot NH_4F)$     (chemical formula I)

$Be_2BO_3F$     (chemical formula II).

Preferably, the beryllium borate fluoride compound is of a trigonal (rhombohedral) system structure.

Preferably, the ammonium beryllium borate fluoride compound is of a trigonal (rhombohedral) system structure.

According to the present invention, the ammonium beryllium borate fluoride compound or the beryllium borate fluoride compound is a nonlinear optical crystal.

(II) Ammonium Beryllium Borate Fluoride Nonlinear Optical Crystalline Material and its Preparation Process and Use The object of the present invention is to overcome the deficiencies of the prior art and to provide a novel ammonium beryllium borate fluoride compound of the chemical formula $NH_4Be_2BO_3F_2$.

Another object of the present invention is to provide a process for preparing the above ammonium beryllium borate fluoride compound.

Another object of the present invention is to provide an ammonium beryllium borate fluoride nonlinear optical crystal having a chemical formula of $NH_4Be_2BO_3F_2$.

A further object of the present invention is to provide a method for growing the above ammonium beryllium borate fluoride nonlinear optical crystal.

Still another object of the present invention is to provide use of the above ammonium beryllium borate fluoride nonlinear optical crystal.

To achieve the object of the present invention, the present invention provides the following technical solution:

an ammonium beryllium borate fluoride compound, whose chemical formula is $NH_4Be_2BO_3F_2$.

According to the present invention, the compound is a nonlinear optical crystal. More preferably, the compound is of a trigonal (rhombohedral) system structure.

The process for preparing the ammonium beryllium borate fluoride compound provided by the present invention comprises the following steps:

preparing raw materials $NH_4F$, BeO and $H_3BO_3$, adding the raw materials into a hydrothermal kettle, followed by addition of water, slowly raising the temperature to 150-240° C., keeping the temperature constant for 5 to 7 days;

cooling followed by separating solid from liquid and washing, to obtain the ammonium beryllium borate fluoride compound.

Wherein, the molar ratio of $NH_4F$, BeO and $H_3BO_3$ is (0.5-2.5):1:(0.5-2.0), preferably (1.0-2.5):1:(0.5-1.5).

Wherein, the water is added in an amount of ⅓-⅔ (ml:ml), preferably ⅓-½ (ml:ml) of the volume of the hydrothermal kettle.

Wherein, preferably, the temperature is slowly raised to 180-220° C.

Wherein, the cooling rate is 5-10° C./hour. Preferably, cooling is carried out to 20-30° C.

Wherein, the solvent used for washing is water, ethanol or a mixture thereof, and multiple solvents shown above can be used for washing in multiple times.

The present invention provides an ammonium beryllium borate fluoride nonlinear optical crystal, whose chemical formula is $NH_4Be_2BO_3F_2$. The crystal does not have a center of symmetry, and belongs to trigonal (rhombohedral) system, its space group is R32, cell parameters are a=4.4418 Å, b=4.4418 Å, c=19.9087 Å, $\alpha=\beta=90°$, $\gamma=120°$, z=3, and unit cell volume is V=340.2 Å$^3$. Its structure is shown in FIG. 2.

The present invention provides a method for growing an ammonium beryllium borate fluoride nonlinear optical crystal by a hydrothermal method and using $H_3BO_3$—$NH_4F$ as mineralizer system, comprising the following steps:

placing an ammonium beryllium borate fluoride compound and a mineralizer comprising $H_3BO_3$ and $NH_4F$ in a hydrothermal kettle, followed by addition of water, raising the temperature to 250-350° C., keeping the temperature constant, after 7-14 days, decreasing the temperature to 40-60° C., stopping heating, cooling, followed by washing, to obtain the ammonium beryllium borate fluoride nonlinear optical crystal of the present invention.

Wherein, the molar ratio of the ammonium beryllium borate fluoride compound to the mineralizer is 1:(2-3).

Wherein, the mass ratio of $H_3BO_3$ to $NH_4F$ in the mineralizer is between ⅙ and ½.

Wherein, the ammonium beryllium borate fluoride compound and the mineralizer are uniformly mixed and then placed in the hydrothermal kettle.

Wherein, the water is added in an amount of ⅓-⅔ (ml:ml), preferably ⅓-½ (ml:ml) of the volume of the hydrothermal kettle.

Wherein, the rate of cooling to 40-60° C. (preferably 50° C.) is 3-10° C. per hour, preferably 5° C. per hour.

Wherein, preferably, cooling is carried out to 20-30° C.

Wherein, the solvent used for washing is water, ethanol or a mixture thereof, and multiple solvents shown above can be used for washing in multiple times.

Wherein, the prepared crystal has a volume greater than 2.0 mm$^3$.

Wherein, the obtained crystals of ammonium beryllium borate fluoride are ground into powder for XRD analysis. The result is shown in FIG. 5.

The present invention provides use of the ammonium beryllium borate fluoride nonlinear optical crystal for frequency conversion of a laser output by a laser.

The present invention provides use of the ammonium beryllium borate fluoride nonlinear optical crystal for generating harmonic light output of double or triple or quadruple or quintuple or sextuple frequency for a laser beam having a wavelength of 1.064 μm.

The present invention provides use of the ammonium beryllium borate fluoride nonlinear optical crystal for generating a harmonic light output below 200 nm.

The present invention provides use of the ammonium beryllium borate fluoride nonlinear optical crystal for a harmonic generator, an optical parametric and amplifying device, and an optical waveguide device in the deep UV region.

The present invention provides use of the ammonium beryllium borate fluoride nonlinear optical crystal for an optical parametric and amplifying device from the infrared to the deep UV region.

The beneficial effects of the present invention:

The present invention provides a novel compound which has the chemical formula of $NH_4Be_2BO_3F_2$. The nonlinear optical crystal (abbreviated as ABBF) prepared by the compound has extremely strong phase matching ability (measured by powder frequency doubling test method, and the powder frequency doubling effect is about 1.5 times than that of $KH_2PO_4$(KDP)); and its UV absorption edge is shorter than 180 nm. In addition, ABBF crystals can achieve the harmonic generator of double, triple, quadruple, quintuple, or sextuple frequency for Nd:YAG ($\lambda=1.064$ μm), or even they are used for generating harmonic light output shorter than 200 nm. Moreover, ABBF crystal is of single crystal structure, colorless and transparent, not deliquescent in the air, and chemically stable (not decomposed until being heated to 445° C.). ABBF will be widely used in a variety of nonlinear optical fields and will pioneer the nonlinear optical applications in the deep UV band.

(III) Beryllium Borate Fluoride Nonlinear Optical Crystalline Material and its Preparation Process and Use The object of the present invention is to overcome the deficiencies of the prior art and to provide a novel beryllium borate fluoride compound of the chemical formula $Be_2BO_3F$.

Another object of the present invention is to provide a process for preparing the above beryllium borate fluoride compound.

Another object of the present invention is to provide a beryllium borate fluoride nonlinear optical crystal having the chemical formula of $Be_2BO_3F$.

A further object of the present invention is to provide two methods for growing the above beryllium borate fluoride nonlinear optical crystal.

Still another object of the present invention is to provide use of the above beryllium borate fluoride nonlinear optical crystal.

To achieve the object of the present invention, the present invention provides the following technical solution:

a beryllium borate fluoride compound of the chemical formula $Be_2BO_3F$, which is trigonal (rhombohedral) beryllium borate fluoride.

The beryllium borate fluoride compound according to the present invention is characterized in that the compound is a nonlinear optical crystal.

The present invention provides a beryllium borate fluoride nonlinear optical crystal having the chemical formula of $Be_2BO_3F$. The crystal does not have a center of symmetry and belongs to trigonal (rhombohedral) system, its space group is R32, cell parameters are a=4.4398Å, b=4.4398Å, c=12.4697Å, $\alpha=\beta=90°$, $\gamma=120°$, z=3, and unit cell volume is V=212.87 Å$^3$. Preferably, its structure is shown in FIG. 7.

The present invention provides a process for preparing a beryllium borate fluoride compound, comprising the following steps:

preparing raw materials $NH_4F$, BeO and $H_3BO_3$, adding the raw materials into a hydrothermal kettle, followed by addition of water, slowly raising the temperature to 180-240° C., keeping the temperature constant for 5-7 days;

cooling followed by separating solid from liquid and washing, to obtain the beryllium borate fluoride compound.

According to the present invention, the molar ratio of $NH_4F$, BeO and $H_3BO_3$ is (0.1-0.8):1:(0.5-2.5), preferably 0.5:1:(0.5-2.5).

Wherein, the water is added in an amount of ⅓-⅔ (ml:ml), preferably ⅓-½ (ml:ml) of the volume of the hydrothermal kettle.

Wherein, preferably, the temperature is slowly raised to 200-220° C.

Wherein, the cooling rate is 5-10° C./hour. Preferably, cooling is carried out to 20-30° C.

Wherein, the solvent used for washing is water, ethanol or a mixture thereof, and multiple solvents shown above can be used for washing in multiple times.

The present invention provides a method for growing the beryllium borate fluoride nonlinear optical crystal by a hydrothermal method and using $H_3BO_3$—$NH_4F$ as mineralizer system, comprising the following steps:

placing a beryllium borate fluoride compound and a mineralizer comprising $H_3BO_3$ and $NH_4F$ into a hydrothermal kettle, followed by addition of water, raising the temperature to 250-350° C., keeping the temperature constant, after 7-14 days, decreasing the temperature to 40-60° C., stopping heating, cooling, followed by washing, to obtain the beryllium borate fluoride nonlinear optical crystal of the present invention.

Wherein, the molar ratio of the beryllium borate fluoride compound to the mineralizer is 1:(2-3).

Wherein, the mass ratio of $NH_4F$ to $H_3BO_3$ in the mineralizer is between ½ and ⅙.

Wherein, the beryllium borate fluoride compound and the mineralizer are uniformly mixed and then placed in a hydrothermal kettle.

Wherein, the water is added in an amount of ⅓-⅔ (ml:ml), preferably ⅓-½ (ml:ml) of the volume of the hydrothermal kettle.

Wherein, the rate of cooling to 40-60° C. (preferably 50° C.) is 3-10° C. per hour, preferably 5° C. per hour.

Wherein, preferably, cooling is carried out to 20-30° C.

Wherein, the solvent used for washing is water, ethanol or a mixture thereof, and multiple solvents shown above can be used for washing in multiple times.

Wherein, the prepared crystal has a volume greater than 2.0 mm$^3$.

Wherein, the obtained beryllium borate fluoride crystals are ground into powder for XRD analysis. The result is shown in FIG. 9.

The present invention provides a method for growing a beryllium borate fluoride nonlinear optical crystal by a flux method to growth and using $B_2O_3$—$NH_4F$ as a flux system, comprising the following steps:

using BeO, $NH_4BF_4$, $B_2O_3$ and $NH_4F$ as raw materials, after mixing uniformly and grinding, placing the raw materials into a platinum tube, then sealing the platinum tube with oxyhydrogen flame;

placing the sealed platinum tube into a reactor, filling alumina powder outside the platinum tube;

raising the temperature of the reactor to 650° C.-800° C. in a resistance wire heating furnace, keeping the temperature constant for 10-15 days, then decreasing the temperature to 350-450° C. at a rate of 1-3° C. per hour, followed by decreasing the temperature to 40-60° C. at the rate of 5-10° C. per hour, stopping heating, cooling to 20-30° C., followed by washing, to obtain the beryllium borate fluoride optical crystal of the present invention.

Wherein, the molar ratio of BeO, $NH_4BF_4$, $B_2O_3$ and $NH_4F$ is 3-8:1-2:6-16:2-5.

Wherein, the solvent used for washing is water, ethanol or a mixture thereof, and multiple solvents shown above can be used for washing in multiple times.

Wherein, the prepared crystal has a volume greater than 0.5 mm$^3$.

Wherein, the obtained beryllium borate fluoride crystals are ground into a powder for XRD analysis. The result is shown in FIG. 10.

The present invention provides use of the beryllium borate fluoride compound or the nonlinear optical crystal. The crystal is used for frequency conversion of a laser output by a laser.

The present invention provides use of the beryllium borate fluoride compound or the nonlinear optical crystal. The crystal is used for generating harmonic light output of double or triple or quadruple or quintuple or sextuple frequency for a laser beam having a wavelength of 1.064 μm.

The present invention provides use of the beryllium borate fluoride compound or the nonlinear optical crystal. The crystal is used for generating a harmonic light output below 200 nm.

The present invention provides use of the beryllium borate fluoride compound or the nonlinear optical crystal. The nonlinear optical crystal is used for a harmonic generator, an optical parametric and amplifying device, and an optical waveguide device in the deep UV region.

The present invention provides use of the beryllium borate fluoride compound or the nonlinear optical crystal. The nonlinear optical crystal is used for optical parametric and amplifying devices from the infrared to the deep UV region.

The beneficial effects of the present invention:

The present invention provides a novel compound which has the chemical formula of $Be_2BO_3F$. The nonlinear optical crystal (abbreviated as BBF) of the compound has extremely strong phase matching ability (measured by powder frequency doubling test method, and the powder frequency doubling effect is about 2.2 times than that of $KH_2PO_4$ (KDP)); and its UV absorption edge is shorter than 180 nm. In addition, BBF crystals can achieve harmonic generator of double, triple, quadruple, quintuple or sextuple frequency for Nd:YAG ($\lambda$=1.064 μm), or even they are used for generating harmonic light output shorter than 200 nm. Moreover, BBF crystal is of single crystal structure, colorless and transparent, not deliquescent in the air, and chemically stable. BBF will be widely used in a variety of nonlinear optical fields and will pioneer the nonlinear optical applications in the deep UV band.

EMBODIMENTS

Figure 2:
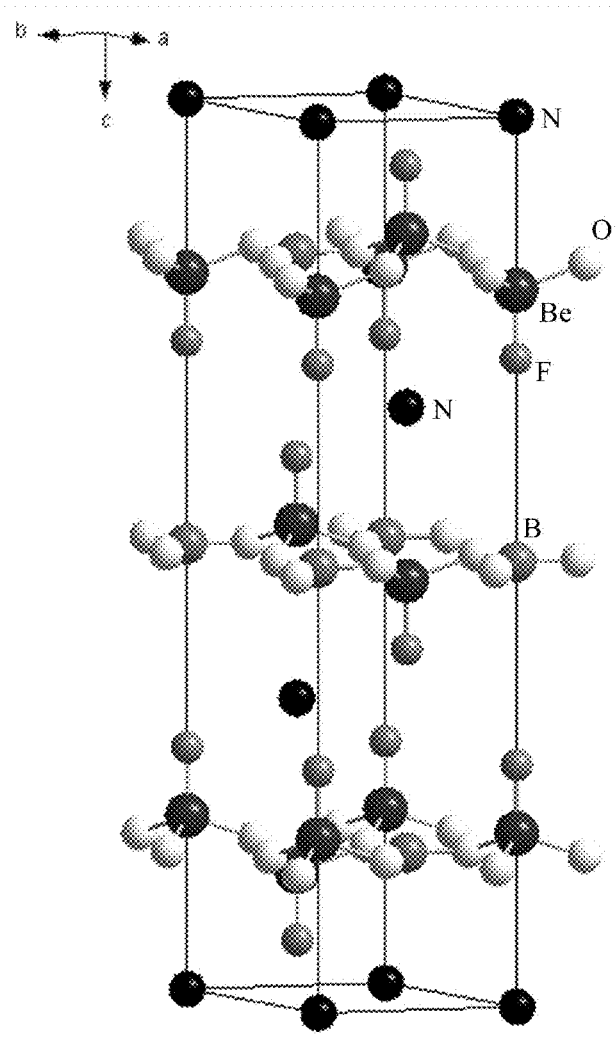
FIG. 2 is a schematic drawing of the structure of ABBF crystal.

As described above, the present invention provides a novel ammonium beryllium borate fluoride nonlinear optical crystal, whose chemical formula is $NH_4Be_2BO_3F_2$. The crystal does not have a center of symmetry, and belongs to trigonal (rhombohedral) system, its space group is R32, cell parameters are a=4.4418 Å, b=4.4418 Å, c=19.9087 Å, $\alpha=\beta=90°$, $\gamma=120°$, z=3, and unit cell volume is V=340.2 Å³. Its structure is shown in FIG. 2. Ammonium ions and fluoride ions are present in the crystal. Ammonium ion and fluoride ion can generate hydrogen bond, and the disadvantage of layered growth habit can be avoided or optimized through the hydrogen bond, thereby opening up the application of deep UV nonlinear optical crystals.

As described above, the present invention also provides a novel beryllium borate fluoride nonlinear optical crystal having the chemical formula of $Be_2BO_3F$. The crystal does not have a center of symmetry and belongs to trigonal (rhombohedral) system, its space group is R32, cell parameters are a=4.4398 Å, b=4.4398 Å, c=12.4697 Å, $\alpha=\beta=90°$, $\gamma=120°$, z=3, and unit cell volume is V=212.87 Å³. This structure is as such: removing the potassium ion from the KBBF while keeping the structural features of KBBF, and directly linking the ($Be_2BO_3$)—layers by fluorine atoms. Thus, the F—O bond can be used to avoid or improve the layered growth habit of KBBF and the defect of uneasy growth in z direction, and can shorten the distance between the layers, thereby opening up the application of deep UV nonlinear optical crystals.

The present invention will be further described with reference to the following examples. It should be noted that the following examples are not intended to limit the protection scope of the present invention, and any improvements made on the basis of the present invention are not contrary to the spirit of the present invention. The raw materials or equipment used in the present invention are commercially available unless otherwise specified.

Example 1 Preparation of Ammonium Beryllium Borate Fluoride Compound by Hydrothermal Process Raw Materials Used:

| | |
|---|---|
| BeO | 0.25 g (0.01 mol) |
| $H_3BO_3$ | 0.93 g (0.015 mol) |
| $NH_4F$ | 0.925 g (0.025 mol) |

Its chemical reaction equation is:

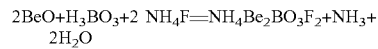

$2BeO+H_3BO_3+2\ NH_4F=NH_4Be_2BO_3F_2+NH_3+2H_2O$

Figure 3:
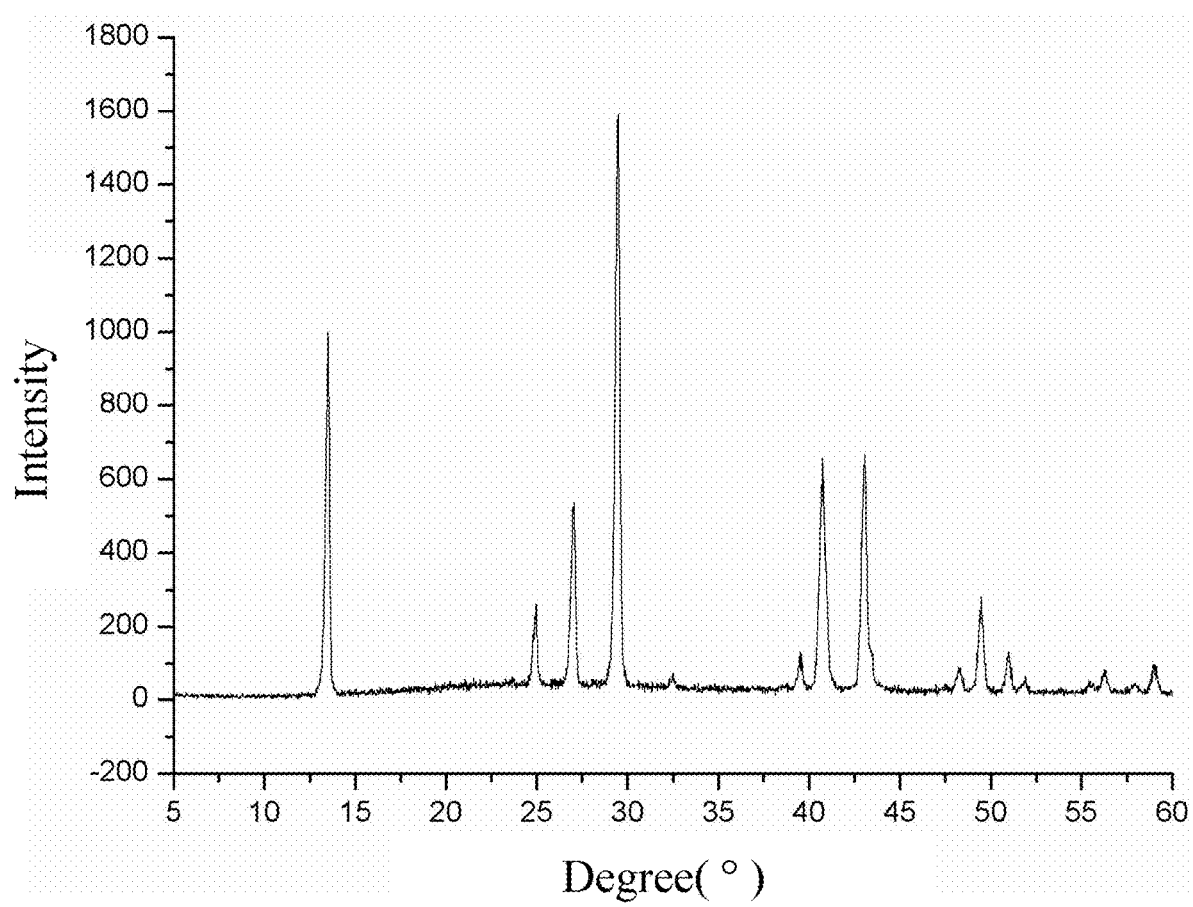
FIG. 3 is an X-ray diffraction pattern of the ABBF powder raw material of Example 1.
Figure 5:
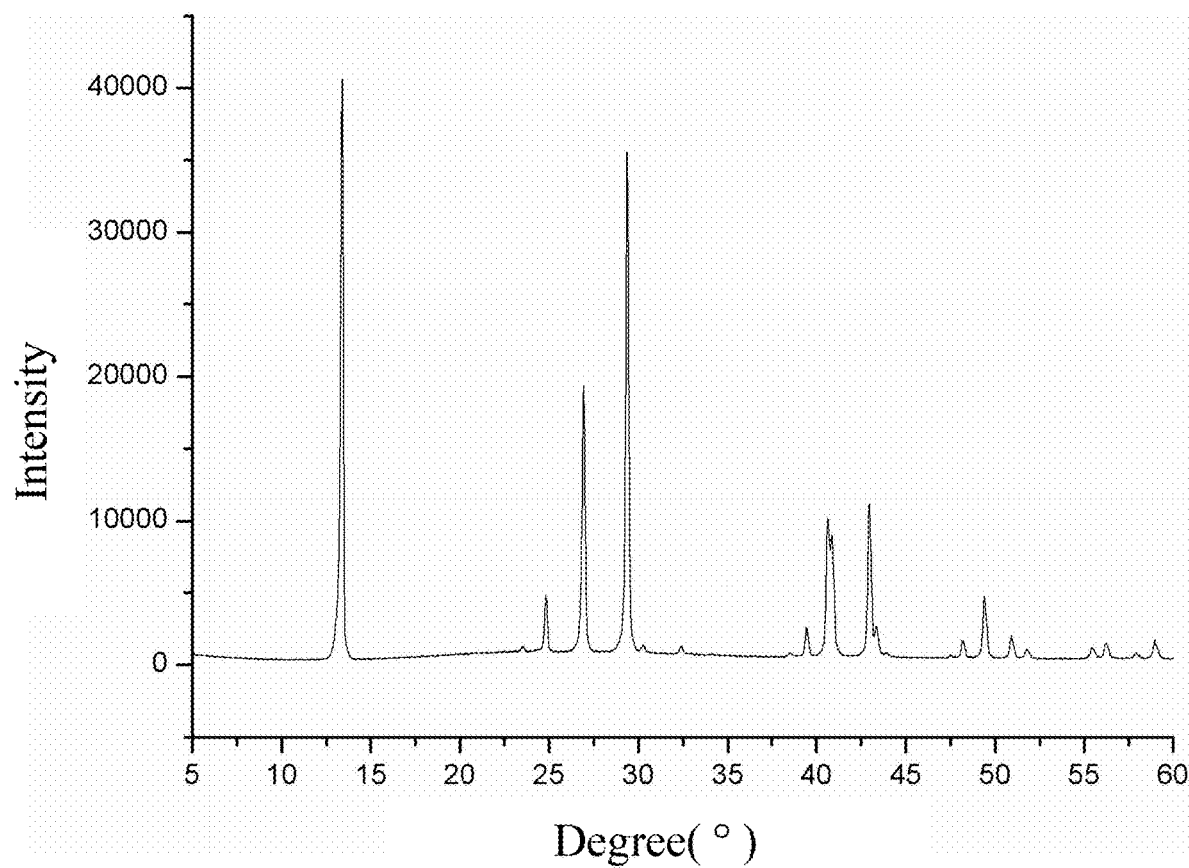
FIG. 5 is an X-ray diffraction pattern of the ABBF single crystal of Example 3 after being ground into powder.

Specific steps were as follows: In an operation box, the above raw materials were weighed according to the above amounts and added into a 23 ml hydrothermal kettle, followed by the addition of 10 ml of distilled water into the hydrothermal kettle, the hydrothermal kettle was placed in an oven, the oven was slowly heated to 220° C., kept at constant temperature for 7 days, and then cooled to 30° C. at a cooling rate of 5° C. per hour. After cooling, the solid in the hydrothermal kettle was separated from liquid and then washed with distilled water and alcohol to obtain pure $NH_4Be_2BO_3F_2$ compound. The product was subjected to X-ray analysis and the resulting pattern (FIG. 3) was consistent with the X-ray pattern of the ABBF single crystal after being ground into powder (FIG. 5).

Example 2 Preparation of Ammonium Beryllium Borate Fluoride Compound by Hydrothermal Process Raw Materials Used:

| | |
|---|---|
| BeO | 2.5 g (0.1 mol) |
| $H_3BO_3$ | 3.1 g (0.05 mol) |
| $NH_4F$ | 5.55 g (0.15 mol) |

Its chemical reaction equation is:

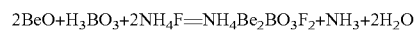

$2BeO+H_3BO_3+2NH_4F=NH_4Be_2BO_3F_2+NH_3+2H_2O$

Figure 4:
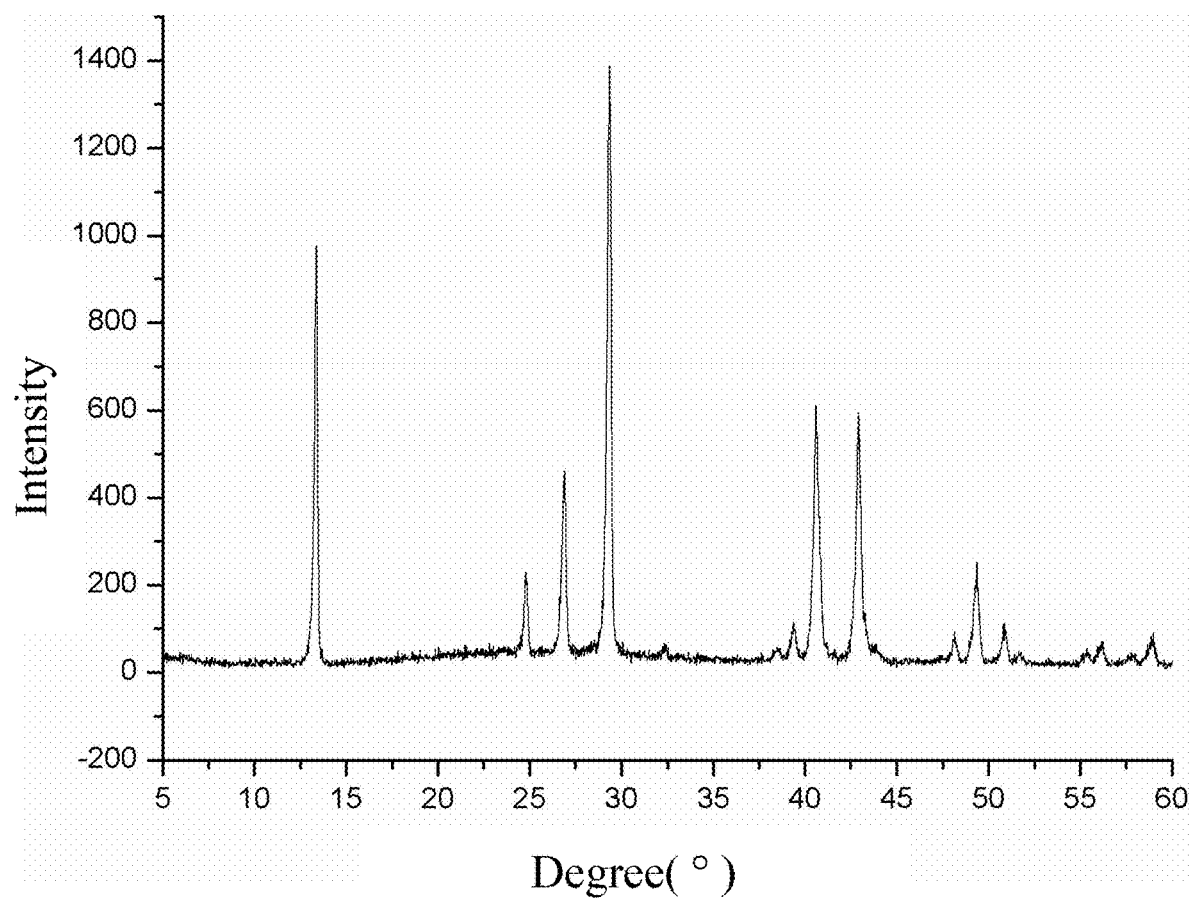
FIG. 4 is an X-ray diffraction pattern of the ABBF powder raw material of Example 2.

Specific steps were as follows: In an operation box, the above raw materials were weighed according to the above amounts and added into a 200 ml hydrothermal kettle, followed by the addition of 100 ml of distilled water, the hydrothermal kettle was then placed in an oven, the oven was slowly heated to 180° C., kept at constant temperature for 7 days, and then cooled to 30° C. at a cooling rate of 5° C. per hour. After cooling, the solid in the hydrothermal kettle was separated from liquid and then washed with distilled water and alcohol to obtain pure $NH_4Be_2BO_3F_2$ compound. The product was subjected to X-ray analysis and the resulting pattern (FIG. 4) was consistent with the X-ray pattern of the ABBF single crystal after being ground into powder (FIG. 5).

Example 3 Growing Ammonium Beryllium Borate Fluoride Single Crystal by Hydrothermal Process Crystal growth device was a resistance wire heating furnace, and the temperature control device was 908PHK20 type programmable automatic temperature control instrument.
Raw Materials Used:

| | |
|---|---|
| $NH_4Be_2BO_3F_2$ | 2 g (0.015 mol) |
| $H_3BO_3$ | 0.62 g (0.01 mol) |
| $NH_4F$ | 1.11 g (0.03 mol) |

Specific steps were as follows: With $H_3BO_3$—$NH_4F$ as mineralizer system, in an operation box, the above raw materials were weighed according to the above amounts and loaded in a hydrothermal kettle having a volume capacity of 35 ml, followed by the addition of 20 ml of distilled water into the hydrothermal kettle, the hydrothermal kettle was then placed in the resistance wire heating furnace and slowly heated to 250° C./330° C. (upper temperature/lower temperature), kept at constant temperature for 10 days, then cooled to 50° C. at a rate of 5° C. per hour, the furnace was turned off, after cooling, the solid in the hydrothermal kettle was separated from liquid and then washed with water and alcohol to obtain ammonium beryllium borate fluoride optical crystal having a size of about 1.5×1.5×1.0 mm. The crystals were ground to powder for X-ray analysis, and the resulting pattern was shown in FIG. 5.

Example 4 Growing Ammonium Beryllium Borate Fluoride Single Crystal by Hydrothermal Process Crystal growth device was resistance wire heating furnace, and temperature control device was 908PHK20 type programmable automatic temperature control instrument.
Raw Materials Used:

| | |
|---|---|
| $NH_4Be_2BO_3F_2$ | 100 g (0.75 mol) |
| $H_3BO_3$ | 31 g (0.5 mol) |
| $NH_4F$ | 55.5 g (1.5 mol) |

Specific steps were as follows: With $H_3BO_3$—$NH_4F$ as mineralizer system, in an operation box, the above raw materials were weighed according to the above amounts, and loaded into a hydrothermal kettle having a volume capacity of 2000 ml, followed by pouring of 1200 ml of distilled water into the hydrothermal kettle, the hydrothermal kettle was placed in the resistance wire heating furnace and slowly heated to 250° C./330° C. (upper temperature/lower temperature), kept at constant temperature for 40 days, then cooled to 50° C. at a rate of 5° C. per hour, the furnace was turned off, after cooling, the solid in the hydrothermal kettle was separated from liquid and then washed with water and alcohol to obtain ammonium beryllium borate fluoride optical crystal having a size of about 5.0×5.0×3.0 mm.

Example 5

Figure 1:
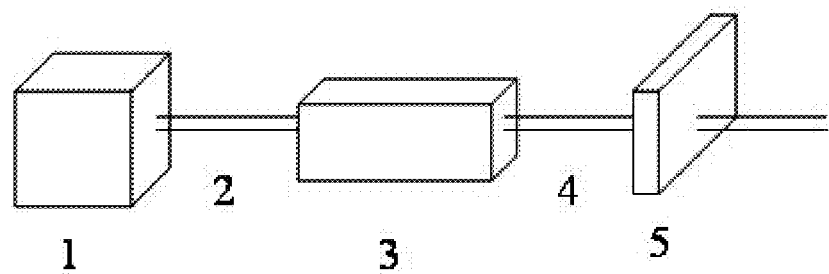
FIG. 1 is a typical schematic drawing of the nonlinear optical effect of ABBF crystal as frequency doubling crystal, wherein 1 is a laser, 2 is an incident laser beam, 3 is ABBF single crystal after crystal post-treatment and optical processing, 4 is a generated exit laser beam, and 5 is a filter.

The crystal obtained in Example 4 was processed and then placed between the laser 1 and the filter 5 in the device shown in FIG. 1 (i.e., the position of reference sign 3), at room temperature, a Q-switched Nd:YAG laser was used as input light source, the incident wavelength was 1064 nm, an obvious 532 nm frequency doubling green light output was observed, the output intensity was about 1.5 times that of KDP under the same conditions.

Example 6

The crystal obtained in Example 4 was processed and then placed between the laser 1 and the filter 5 in the device shown in FIG. 1 (i.e., the position of reference sign 3), at room temperature, the frequency doubling light of the Q-switched Nd:YAG laser was used as input light source, the incident wavelength was 532 nm, an obvious 266 nm frequency doubling UV light output was observed.

Example 7

The crystal obtained in Example 4 was processed and then placed between the laser 1 and the filter 5 in the device shown in FIG. 1 (i.e., the position of reference sign 3), at room temperature, the frequency tripling light of the Q-switched Nd:YAG laser was used as input light source, the incident wavelength was 355 nm, a 177.3 nm frequency doubling deep UV light output was observed.

Example 8 Preparation of Beryllium Borate Fluoride Compound by Hydrothermal Process Raw Materials Used:

| | |
|---|---|
| BeO | 0.25 g (0.01 mol) |
| $H_3BO_3$ | 1.55 g (0.025 mol) |
| $NH_4F$ | 0.185 g (0.005 mol) |

Its chemical reaction equation is:

$2BeO+H_3BO_3+NH_4F=Be_2BO_3F+NH_3+2H_2O$

Figure 8:
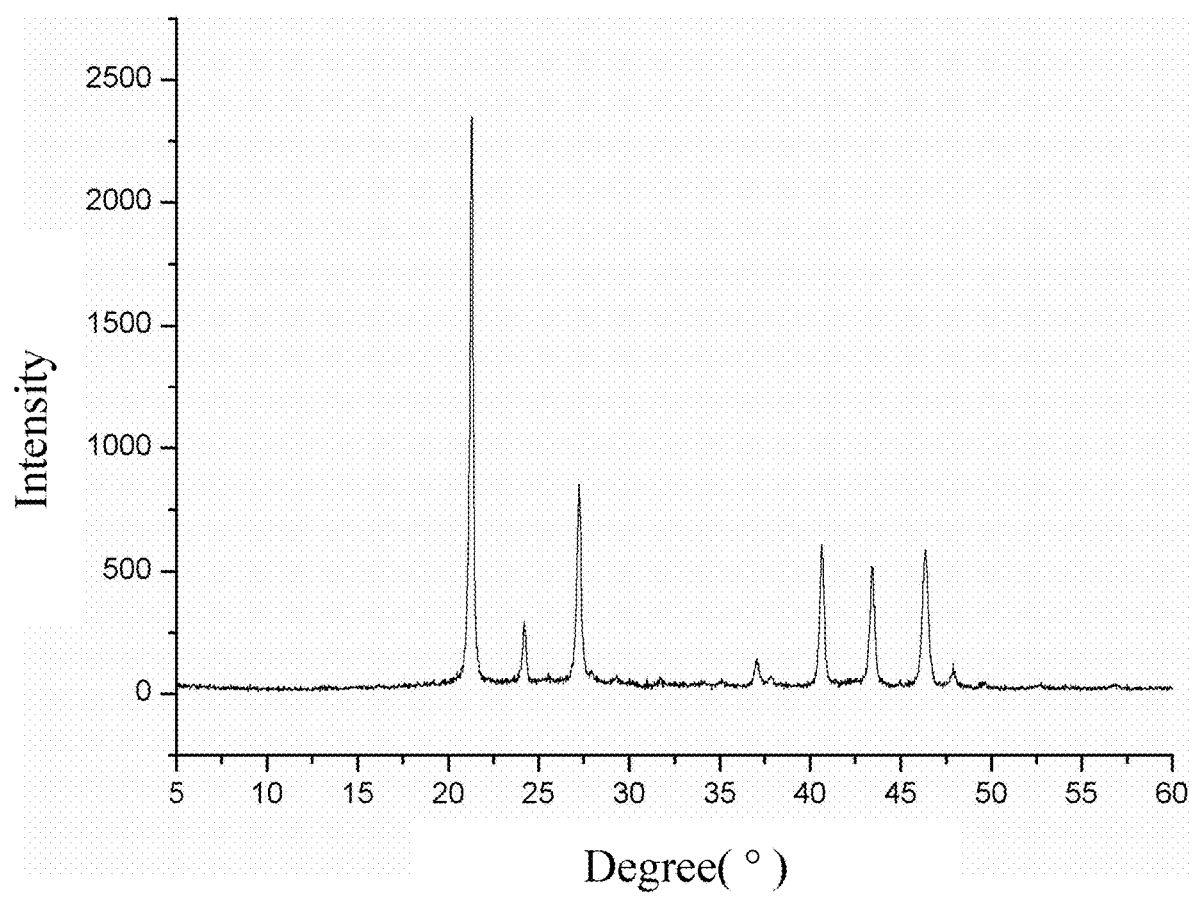
FIG. 8 is an X-ray diffraction pattern of the BBF powder raw material of Example 8.
Figure 10:
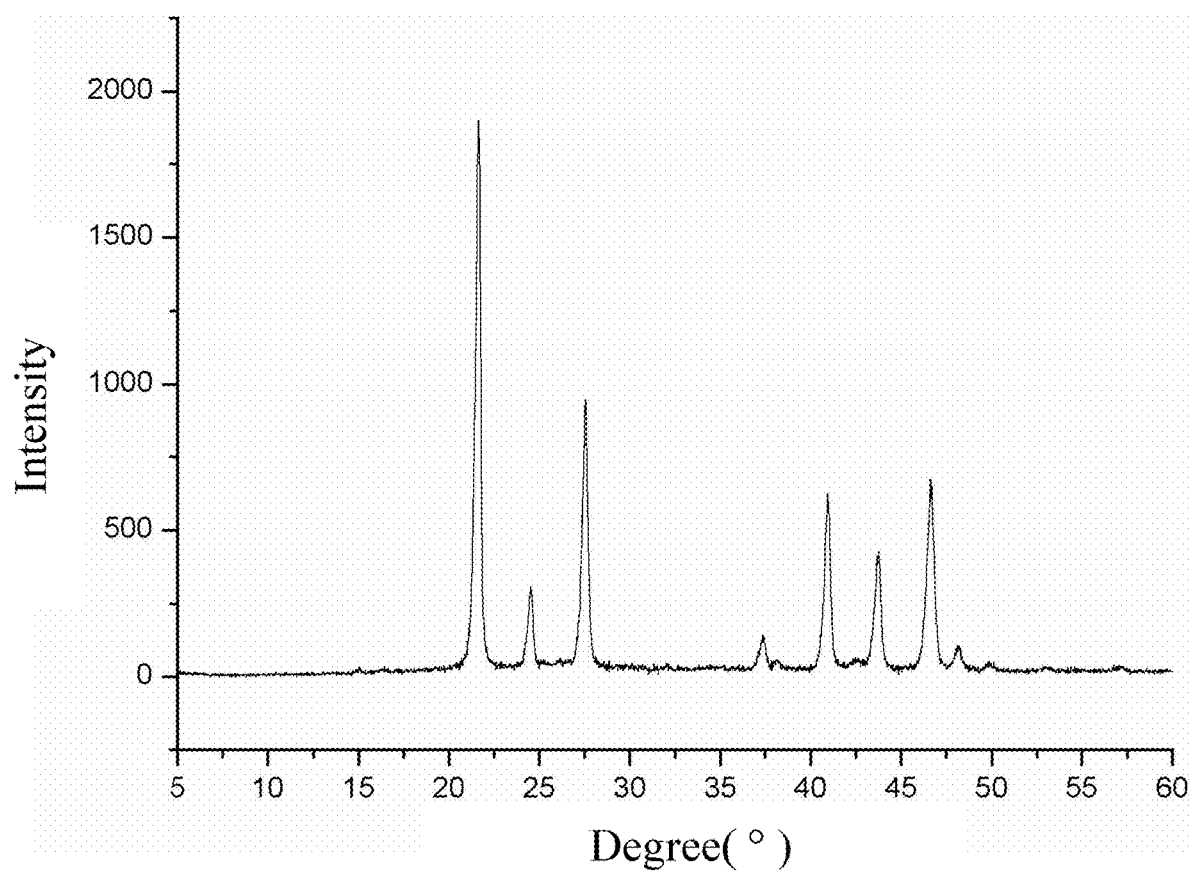
FIG. 10 is an X-ray diffraction pattern of the BBF single crystal of Example 10 after being ground into powder.

Specific steps were as follows: In an operation box, the above raw materials were weighed according to the above amounts, placed in a 23 ml hydrothermal kettle, followed by the addition of 10 ml of distilled water into the hydrothermal kettle, the hydrothermal kettle was placed in an oven, the oven was slowly heated to 220° C., kept at constant temperature for 7 days, and then cooled to 30° C. at a cooling rate of 5° C. per hour. After cooling, the solid in the hydrothermal kettle was separated from liquid and then washed with distilled water and alcohol to obtain $Be_2BO_3F$ compound. The product was subjected to X-ray analysis and the resulting pattern (FIG. 8) was consistent with the X-ray pattern of the BBF single crystal after being ground into powder (FIG. 10).

Example 9 Growing Beryllium Borate Fluoride Single Crystal by Hydrothermal Process Crystal growth device was resistance wire heating furnace, and temperature control device was 908PHK20 type programmable automatic temperature control instrument.

Raw Materials Used:

| | |
|---|---|
| $Be_2BO_3F$ | 2.5 g (0.026 mol) |
| $H_3BO_3$ | 1.86 g (0.03 mol) |
| $NH_4F$ | 0.555 g (0.015 mol) |

Figure 9:
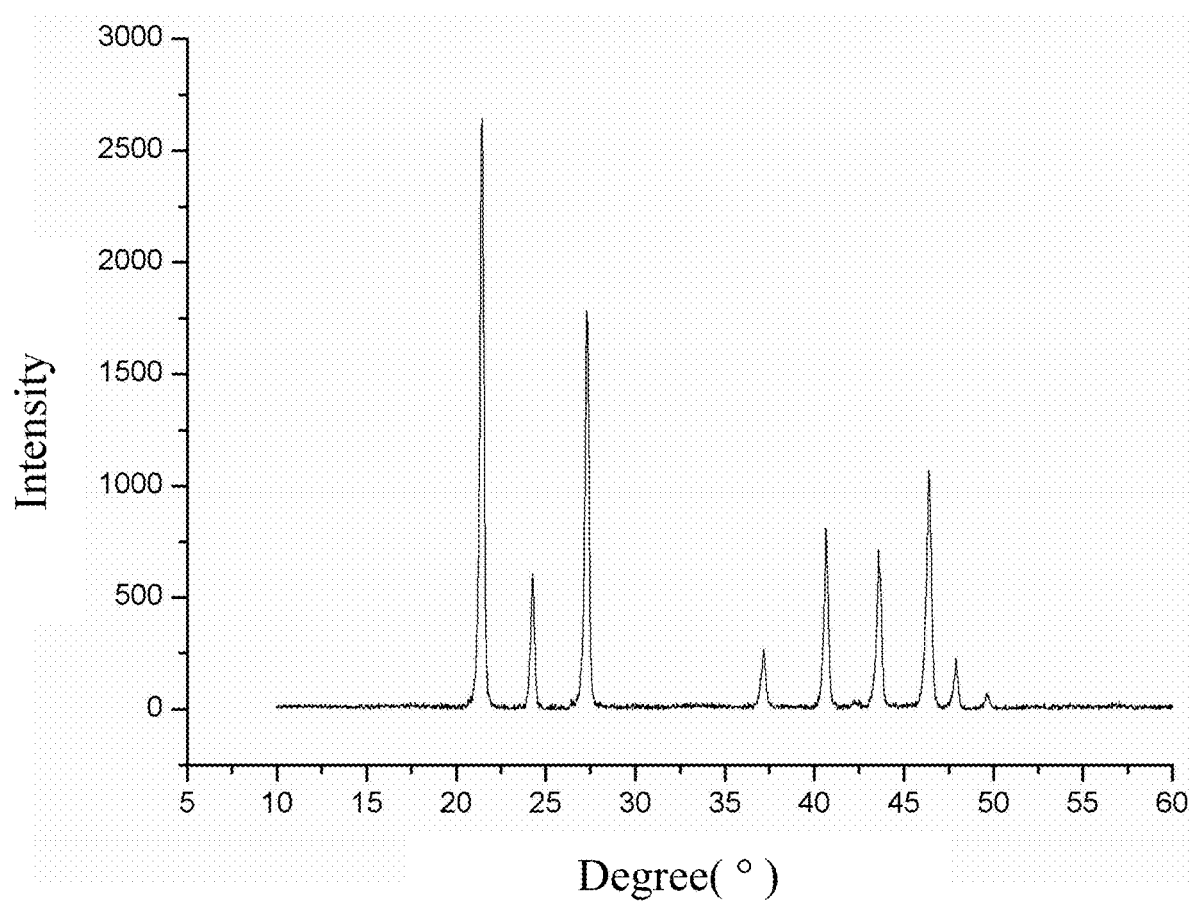
FIG. 9 is an X-ray diffraction pattern of the BBF single crystal of Example 9 after being ground into powder.

Specific steps were as follows: With $H_3BO_3$—$NH_4F$ as mineralizer system, in an operation box, the above raw materials were weighed according to the above amounts, and loaded in a hydrothermal kettle having a capacity of 35 ml, followed by the addition of 20 ml of distilled water into the hydrothermal kettle, the reaction kettle was placed in the resistance wire heating furnace and slowly heated to 250° C./330° C. (upper temperature/lower temperature), kept at constant temperature for 12 days, then cooled to 50° C. at a rate of 5° C. per hour, the furnace was turned off, after cooling, the solid in the hydrothermal kettle was separated from liquid and then washed with water and alcohol to obtain beryllium borate fluoride optical crystal having a size of about 1.2×1.2×0.8 mm. The crystals were ground to powder for X-ray analysis, and the resulting pattern was shown in FIG. 9.

Example 10 Growing Beryllium Borate Fluoride Single Crystal by Hydrothermal Process Crystal growth device was resistance wire heating furnace, and temperature control device was 908PHK20 type programmable automatic temperature control instrument.
Raw Materials Used:

| | |
|---|---|
| $Be_2BO_3F$ | 72 g (0.75 mol) |
| $H_3BO_3$ | 93 g (1.5 mol) |
| $NH_4F$ | 27.75 g (0.75 mol) |

Specific steps were as follows: With $H_3BO_3$—$NH_4F$ as mineralizer system, in an operation box, the above raw materials were weighed according to the above amounts, and loaded in a hydrothermal kettle having a capacity of 2000 ml, followed by the addition of 1200 ml of distilled water into the hydrothermal kettle, the reaction kettle was placed in the resistance wire heating furnace and slowly heated to 250° C./330° C. (upper temperature/lower temperature), kept at constant temperature for 40 days, then cooled to 50° C. at a rate of 5° C. per hour, the furnace was turned off, after cooling, the solid in the hydrothermal kettle was separated from liquid and then washed with water and alcohol to obtain beryllium borate fluoride optical crystal having a size of about 4.5×4.5×3 mm (FIG. 10).

Example 11 Growing Beryllium Borate Fluoride Single Crystal by Flux Process

Crystal growth device was resistance wire heating furnace, and temperature control device was 908PHK20 type programmable automatic temperature control instrument. $B_2O_3$—$NH_4F$ was selected as flux, and through spontaneous nucleation, crystals were obtained.
Raw Materials Used:

| | |
|---|---|
| BeO | 2.25 g (0.09 mol) |
| $NH_4BF_4$ | 1.575 g (0.015 mol) |
| $NH_4F$ | 5.55 g (0.15 mol) |
| $B_2O_3$ | 2.1 g (0.03 mol) |

Its chemical reaction equation is:

$$6BeO + NH_4BF_4 + B_2O_3 = 3Be_2BO_3F + NH_4F$$

Specific steps were as follows: In an operation box, the above raw materials were weighed according to the above amounts, mixed uniformly, and loaded in a platinum tube, then the platinum tube was sealed with oxyhydrogen flame. The sealed platinum tube was placed in a reactor with alumina powder filling the outside part of the platinum tube. The reactor was placed in a growth furnace, heated to 750° C., kept at constant temperature for 12 days, and then cooled to 400° C. at a rate of 2° C. per hour, subsequently to 50° C. at a rate of 10° C. per hour, the furnace was turned off, after cooling to room temperature, the solid in the platinum tube was washed with water and alcohol to obtain beryllium borate fluoride optical crystal having a size of about 1.0×1.0×0.6 mm.

Example 12 Growing Beryllium Borate Fluoride Single Crystal by Flux Process

Crystal growth device was resistance wire heating furnace, and temperature control device was 908PHK20 type programmable automatic temperature control instrument. $B_2O_3$—$NH_4F$ was selected as flux, and through spontaneous nucleation, crystals were obtained.
Raw Materials Used:

| | |
|---|---|
| BeO | 22.5 g (0.9 mol) |
| $NH_4BF_4$ | 15.75 g (0.15 mol) |
| $NH_4F$ | 55.5 g (1.5 mol) |
| $B_2O_3$ | 21 g (0.3 mol) |

Its chemical reaction equation is:

$$6BeO + NH_4BF_4 + B_2O_3 = 3Be_2BO_3F + NH_4F$$

Specific steps were as follows: In an operation box, the above raw materials were weighed according to the above amounts, mixed uniformly, and loaded in a platinum tube, then the platinum tube was sealed with oxyhydrogen flame. The sealed platinum tube was placed in a reactor with alumina powder filling the outside part of the platinum tube. The reactor was placed in a growth furnace, heated to 750° C., kept at constant temperature for 40 days, and then cooled to 400° C. at a rate of 2° C. per hour, subsequently to 50° C. at a rate of 10° C. per hour, the furnace was turned off, after cooling to room temperature, the solid in the platinum tube was washed with water and alcohol to obtain beryllium borate fluoride optical crystal having a size of about 3.5×3.5×2.5 mm.

Example 13

Figure 6:
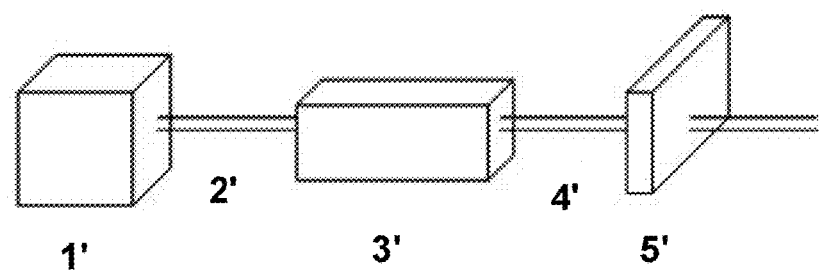
FIG. 6 is a typical schematic drawing of the nonlinear optical effect of BBF crystal as frequency doubling crystal, wherein 1' is a laser, 2' is an incident laser beam, 3' is BBF single crystal after crystal post-treatment and optical processing, 4' is a generated exit laser beam, and 5' is a filter.

The crystal obtained in Example 11 was processed and then placed between the laser 1' and the filter 5' in the device shown in FIG. 6 (i.e., the position of reference sign 3'), at room temperature, a Q-switched Nd:YAG laser was used as input light source, the incident wavelength was 1064 nm, an obvious 532 nm frequency doubling green light output was observed, the output intensity was about 2.2 times that of KDP under the same conditions.

Example 14

The crystal obtained in Example 11 was processed and then placed between the laser 1' and the filter 5' in the device shown in FIG. 6 (i.e., the position of reference sign 3'), at room temperature, the frequency doubling light of the Q-switched Nd:YAG laser was used as input light source, the incident wavelength was 532 nm, an obvious 266 nm frequency doubling UV light output was observed.

Example 15

The crystal obtained in Example 11 was processed and then placed between the laser 1' and the filter 5' in the device shown in FIG. 6 (i.e., the position of reference sign 3'), at room temperature, the frequency tripling light of the Q-switched Nd:YAG laser was used as input light source, the incident wavelength was 355 nm, a 177.3 nm frequency doubling deep UV light output was observed.

We claim:

1. A fluorine boron beryllium salt, having a chemical formula of $Be_2BO_3F$, and is a nonlinear optical crystal having a trigonal structure, wherein the nonlinear optical crystal crystallizes in a non-centrosymmetrical structure with a space group of R32, and cell parameters of a=4.4398 Å, b=4.4398 Å, c=12.4697 Å, α=β=90°, γ=120°, z=3, and unit cell volume (V)=212.87 Å$^3$.

Figure 7:
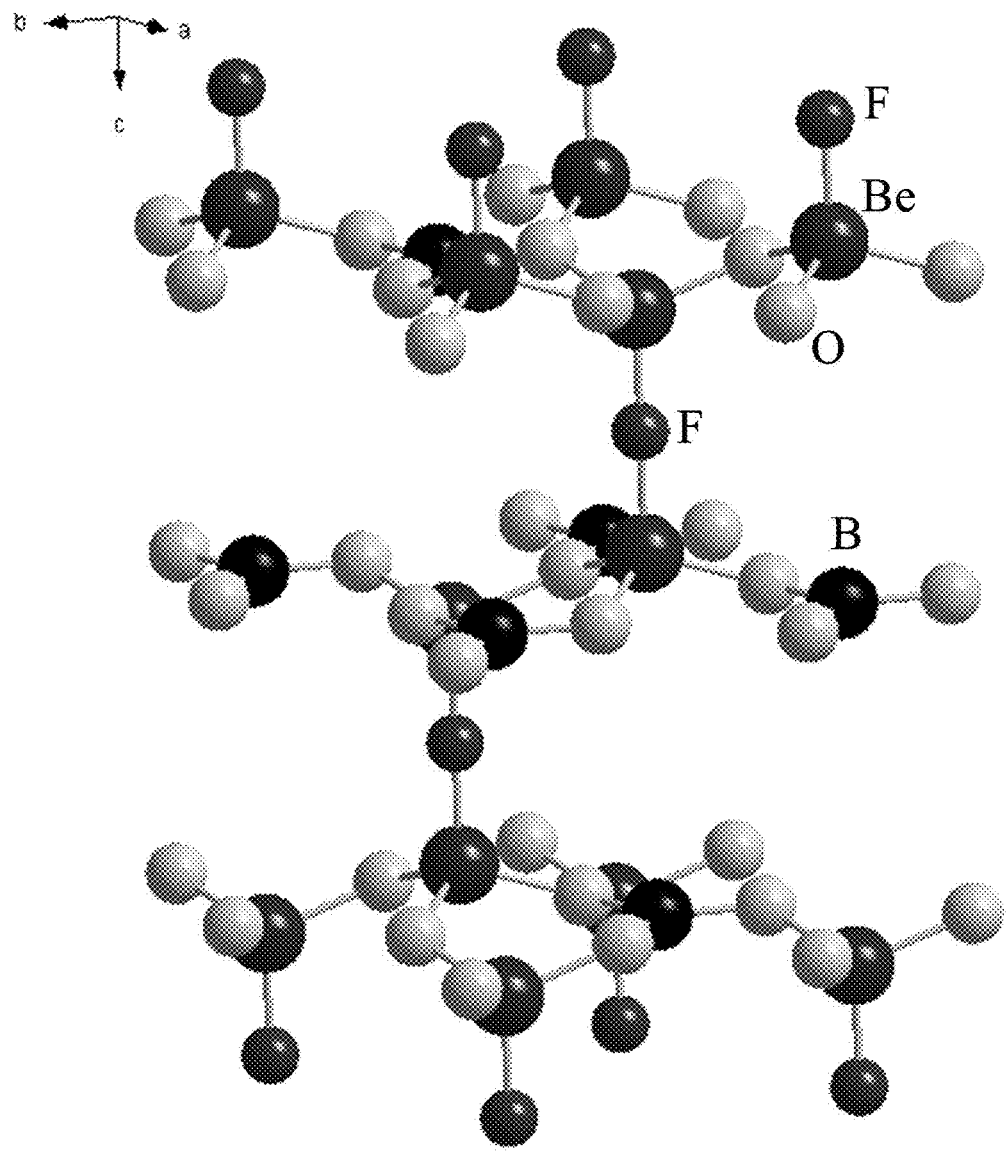
FIG. 7 is a schematic drawing of the structure of BBF crystal.

2. The fluorine boron beryllium salt of claim 1, having a structure shown in FIG. 7.

3. A process for preparing the fluorine boron beryllium salt according to claim 1, comprising:
preparing raw materials $NH_4F$, BeO and $H_3BO_3$;
adding the raw materials into a hydrothermal kettle, followed by addition of water;
raising the temperature to 180-240° C., keeping the temperature constant for 5-7 days; and
cooling followed by separating solid from liquid and washing to obtain the fluorine boron beryllium salt.

4. The process according to claim 3, wherein the molar ratio of $NH_4F$, BeO and $H_3BO_3$ is (0.1-0.8):1:(0.5-2.5); and/or
the water is added in an amount of ⅓-⅔ (ml:ml) of the volume of the hydrothermal kettle; and/or
the cooling rate is 5-10° C/hour.

5. A method for growing the fluorine boron beryllium salt nonlinear optical crystal according to claim 1, comprising:
adding a fluorine boron beryllium compound, a mineralizer comprising $H_3BO_3$ and $NH_4F$, and water into a hydrothermal kettle to form a mixture;
maintaining a temperature of the mixture at 250-350° C. for 7-14 days;
decreasing the temperature to 40-60° C.; and
cooling and washing and obtaining the fluorine boron beryllium salt nonlinear optical crystal.

6. The method according to claim 5, wherein the molar ratio of the fluorine boron beryllium compound to the mineralizer is 1:(2-3); and/or the mass ratio of $NH_4F$ to $H_3BO_3$ in the mineralizer is between ½ and ⅙; and/or the water is added in an amount of ⅓-⅔ (ml:ml) of the volume of the hydrothermal kettle; and/or
the rate of cooling to 40-60° C. is 3-10° C. per hour.

7. The method according to claim 5, wherein the fluorine boron beryllium salt nonlinear optical crystal has a volume greater than 2.0 mm$^3$.

8. The method for growing the fluorine boron beryllium salt nonlinear optical crystal according to claim 1, comprising:
mixing and grinding BeO, $NH_4BF_4$, $B_2O_3$ and $NH_4F$ to form a mixture;
placing the mixture into a platinum tube, then sealing the platinum tube with oxyhydrogen flame;
placing the sealed platinum tube into a reactor, filling alumina powder outside the platinum tube; and
raising the temperature of the reactor to 650° C-800° C. in a resistance wire heating furnace, keeping the temperature constant for 10-15 days, then decreasing the temperature to 350-450° C. at a rate of 1-3° C. per hour, followed by decreasing the temperature to 40-60° C. at the rate of 5-10° C. per hour, stopping heating, cooling to 20-30° C., followed by washing, to obtain the nonlinear optical crystal.

9. The method according to claim 8, wherein the molar ratio of BeO, $NH_4BF_4$, $B_2O_3$ and $NH_4F$ is 3-8:1-2:6-16:2-5.

10. The method according to claim 8, wherein the fluorine boron beryllium salt nonlinear optical crystal has a volume greater than 0.5 mm$^3$.

11. A method for frequency conversion of a laser beam, comprising:
passing the laser beam through the nonlinear optical crystal according to claim 1; and
generating a harmonic light output of double, triple, quadruple, quintuple, or sextuple frequency, wherein the laser beam has a wavelength of 1.064 μm,
and/or wherein the harmonic light output has a wavelength of below 200 nm.

12. A process for preparing ammonium beryllium borate fluoride having a chemical formula of $NH_4B_{e2}BO_3F_2$ comprising:
preparing raw materials $NH_4F$, BeO and $H_3BO_3$,
adding the raw materials into a hydrothermal kettle, followed by addition of water,
raising the temperature to 150-240° C., keeping the temperature constant for 5 to 7 days;
cooling followed by separating solid from liquid and washing to obtain the ammonium beryllium borate fluoride compound.

13. A process according to claim 12, wherein the molar ratio of $NH_4F$, BeO and $H_3BO_3$ is (0.5-2.5):1:(0.5-2.0); and/or
the water is added in an amount of ⅓-⅔ (ml:ml) of the volume of the hydrothermal kettle;
the temperature is raised to 180-220° C.; and/or
the cooling rate is 5-10° C./hour; and/or
cooling is carried out to 20-30° C.

* * * * *